United States Patent
Son et al.

(10) Patent No.: US 12,142,493 B2
(45) Date of Patent: Nov. 12, 2024

(54) SUBSTRATE PROCESSING APPARATUS AND SUBSTRATE PROCESSING METHOD

(71) Applicant: SEMES CO., LTD., Chungcheongnam-do (KR)

(72) Inventors: Young Jun Son, Chungcheongnam-do (KR); Tae Hoon Lee, Chungcheongnam-do (KR); Sung Gyu Lee, Chungcheongnam-do (KR); Hyun Yoon, Chungcheongnam-do (KR); Do Yeon Kim, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 72 days.

(21) Appl. No.: 17/986,894

(22) Filed: Nov. 15, 2022

(65) Prior Publication Data
US 2023/0215742 A1   Jul. 6, 2023

(30) Foreign Application Priority Data
Dec. 31, 2021   (KR) .................. 10-2021-0193592

(51) Int. Cl.
*H01L 21/67*   (2006.01)
*B01D 35/02*   (2006.01)

(52) U.S. Cl.
CPC ........ *H01L 21/67051* (2013.01); *B01D 35/02* (2013.01)

(58) Field of Classification Search
CPC ............................................... H01L 21/67051
See application file for complete search history.

(56) References Cited

U.S. PATENT DOCUMENTS

| | | | |
|---|---|---|---|
| 6,741,445 B1 * | 5/2004 | Phan | H01L 21/67253 361/230 |
| 2018/0028983 A1 | 2/2018 | Takashima et al. | |
| 2019/0043741 A1 | 2/2019 | Kim et al. | |

FOREIGN PATENT DOCUMENTS

| | | |
|---|---|---|
| JP | 2003-297788 | 10/2003 |
| JP | 2008-251756 | 10/2008 |
| JP | 2019-36594 | 3/2019 |
| JP | 2020-196013 | 12/2020 |
| KR | 10-2009-0061911 | 6/2009 |
| KR | 2010006957 U * | 7/2010 |
| KR | 10-1023751 | 3/2011 |

(Continued)

OTHER PUBLICATIONS

Machine translation: KR2010006957; Han, G. (Year: 2010).*

(Continued)

*Primary Examiner* — Natasha N Campbell
(74) *Attorney, Agent, or Firm* — Womble Bond Dickinson (US) LLP

(57) ABSTRACT

A substrate processing apparatus includes: a nozzle unit configured to discharge a processing liquid to a substrate; a pipe connected to the nozzle unit and a processing liquid supply unit supplying the processing liquid; a charge amount control unit disposed at the pipe, including a filter unit charged with positive charges or negative charges, and including at least one of a control valve, controlling a flow rate of the processing liquid passing through an inside of the filter unit, and a power supply unit, applying a voltage to the filter unit, to control a charge amount of the processing liquid; and a control unit connected to the charge amount control unit.

16 Claims, 10 Drawing Sheets

(56) References Cited

FOREIGN PATENT DOCUMENTS

| | | |
|---|---|---|
| KR | 10-2012-0126384 | 11/2012 |
| KR | 10-2017-0138346 | 12/2017 |
| KR | 10-2019-0010630 | 1/2019 |
| KR | 10-2019-0015666 | 2/2019 |
| KR | 10-2020-0019018 | 2/2020 |
| KR | 10-2020-0028572 | 3/2020 |
| WO | 2017/205722 | 11/2017 |

OTHER PUBLICATIONS

Office Action dated Feb. 20, 2024 for Japanese Patent Application No. 2022-196824 and its English translation from Global Dossier.
Office Action dated Aug. 21, 2023 for Korean Patent Application No. 10-2021-0193592 and its English translation from Global Dossier.

* cited by examiner

[FIG. 1]
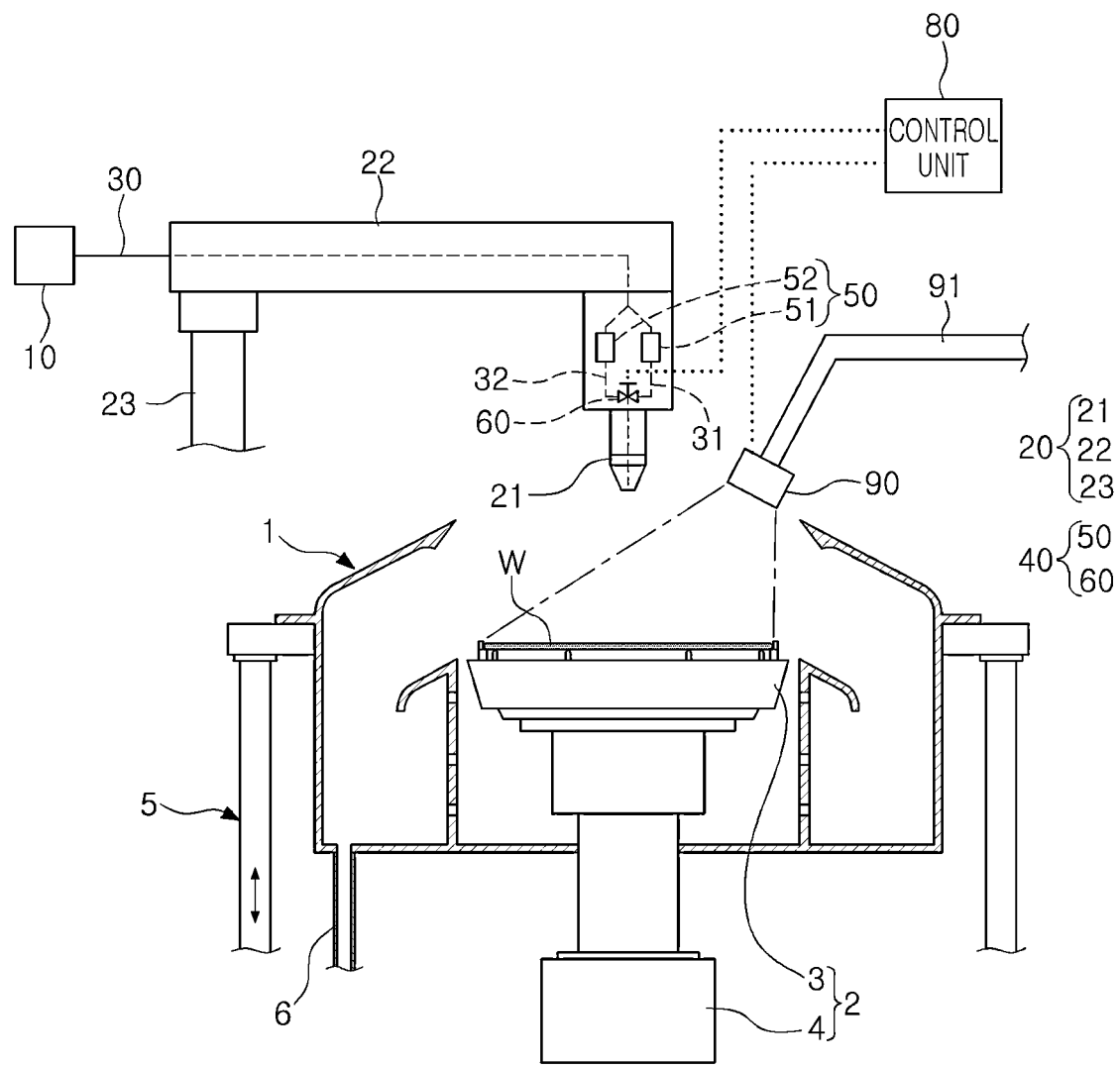

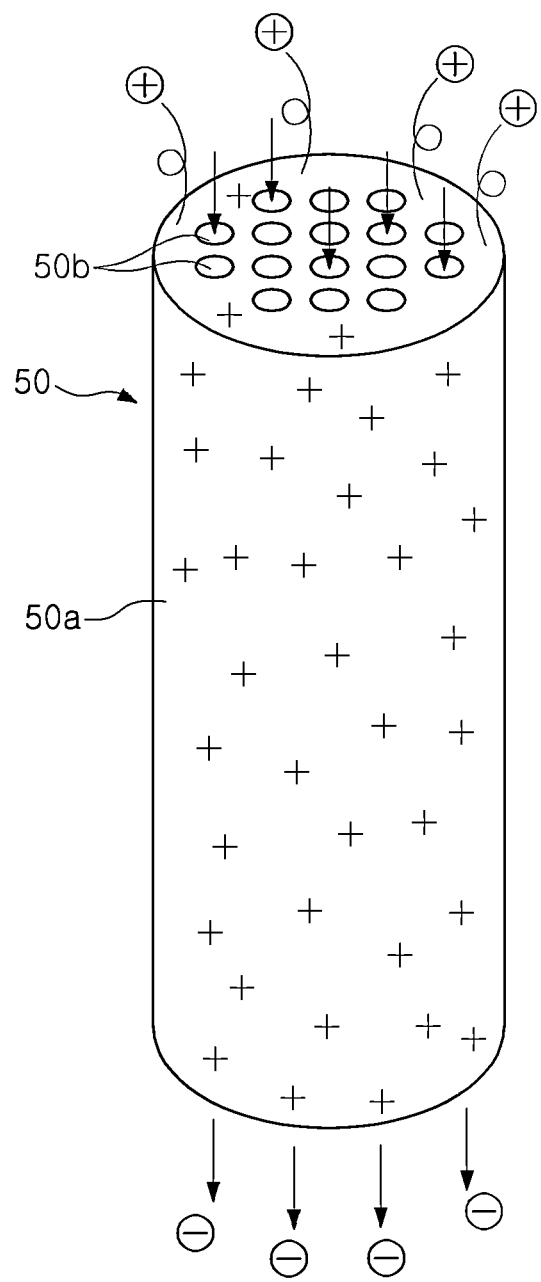
[FIG. 2]

[FIG. 3]
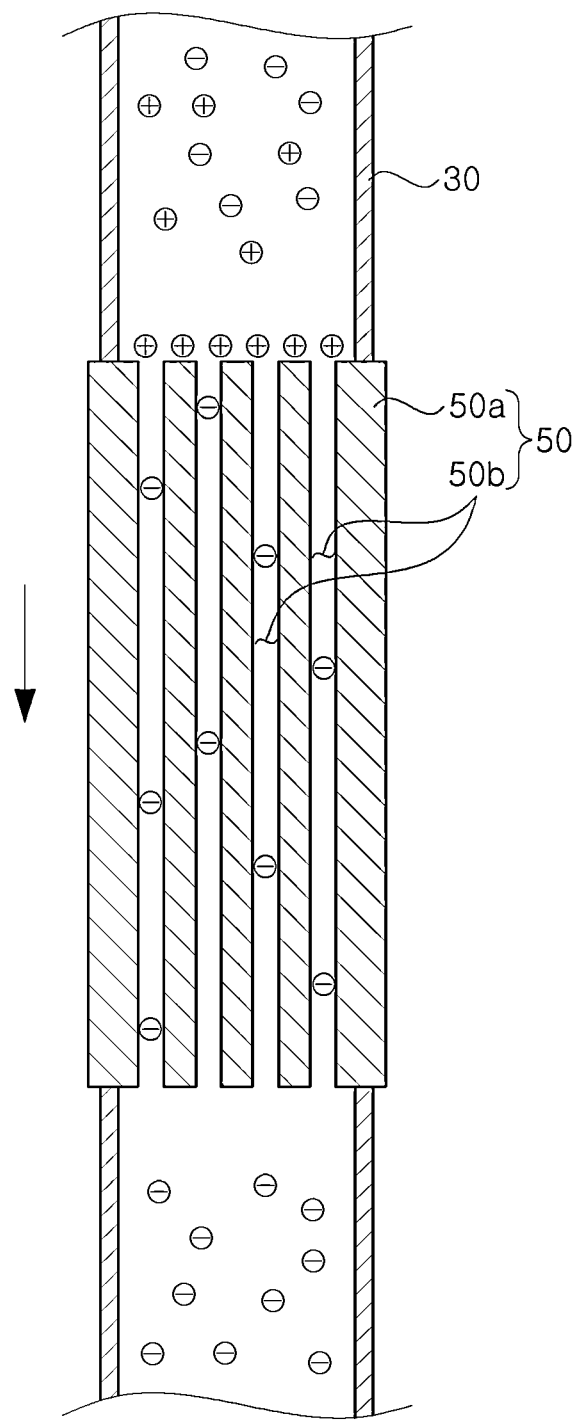

[FIG. 4]
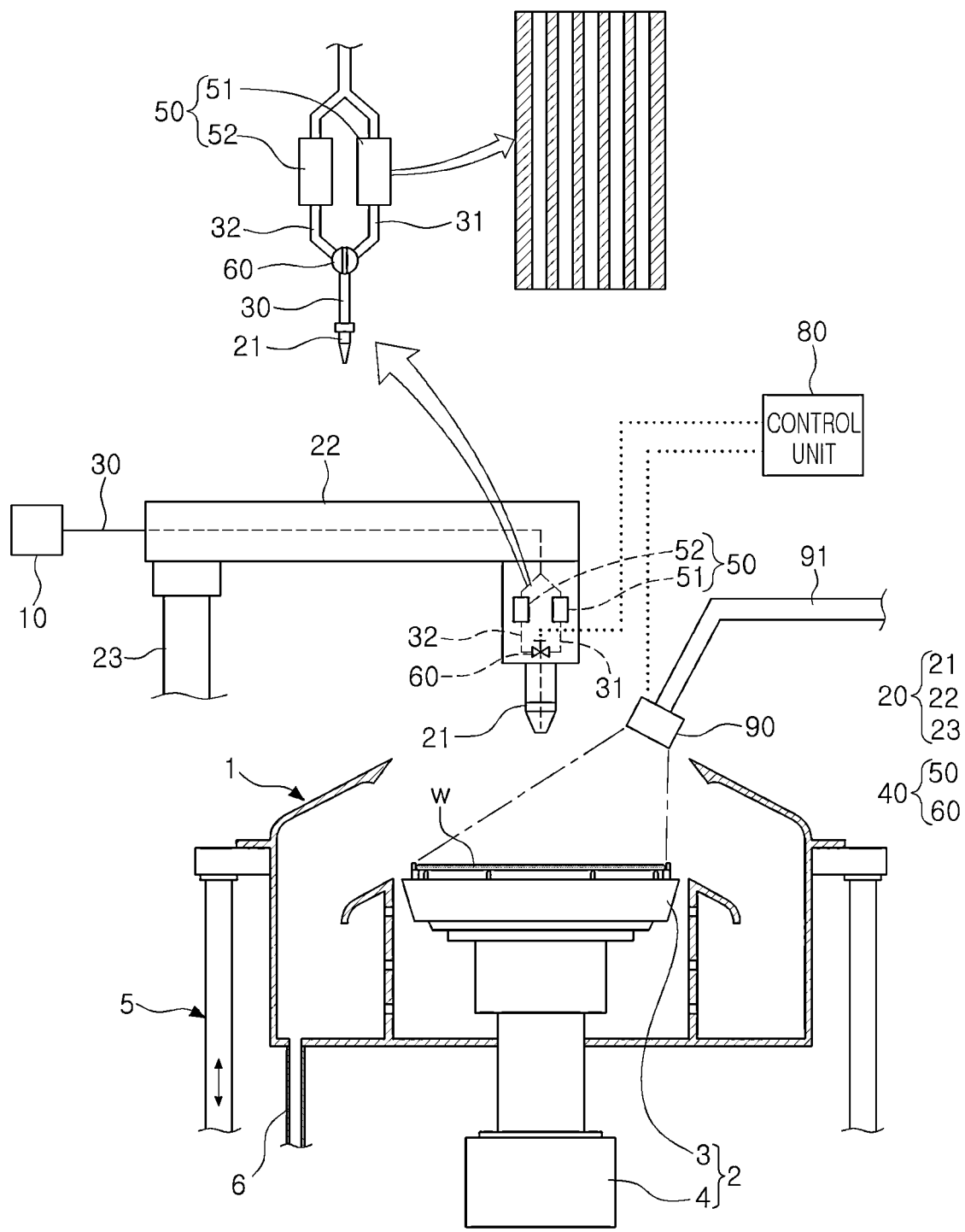

[FIG. 5]
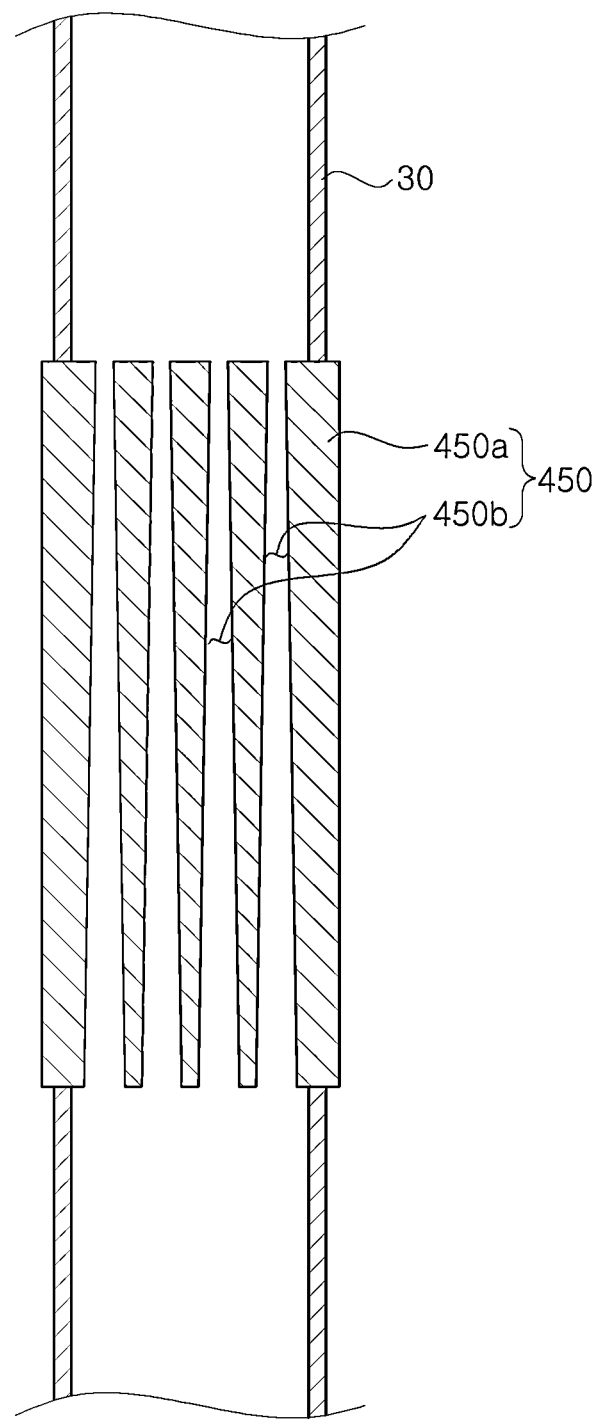

[FIG. 6]
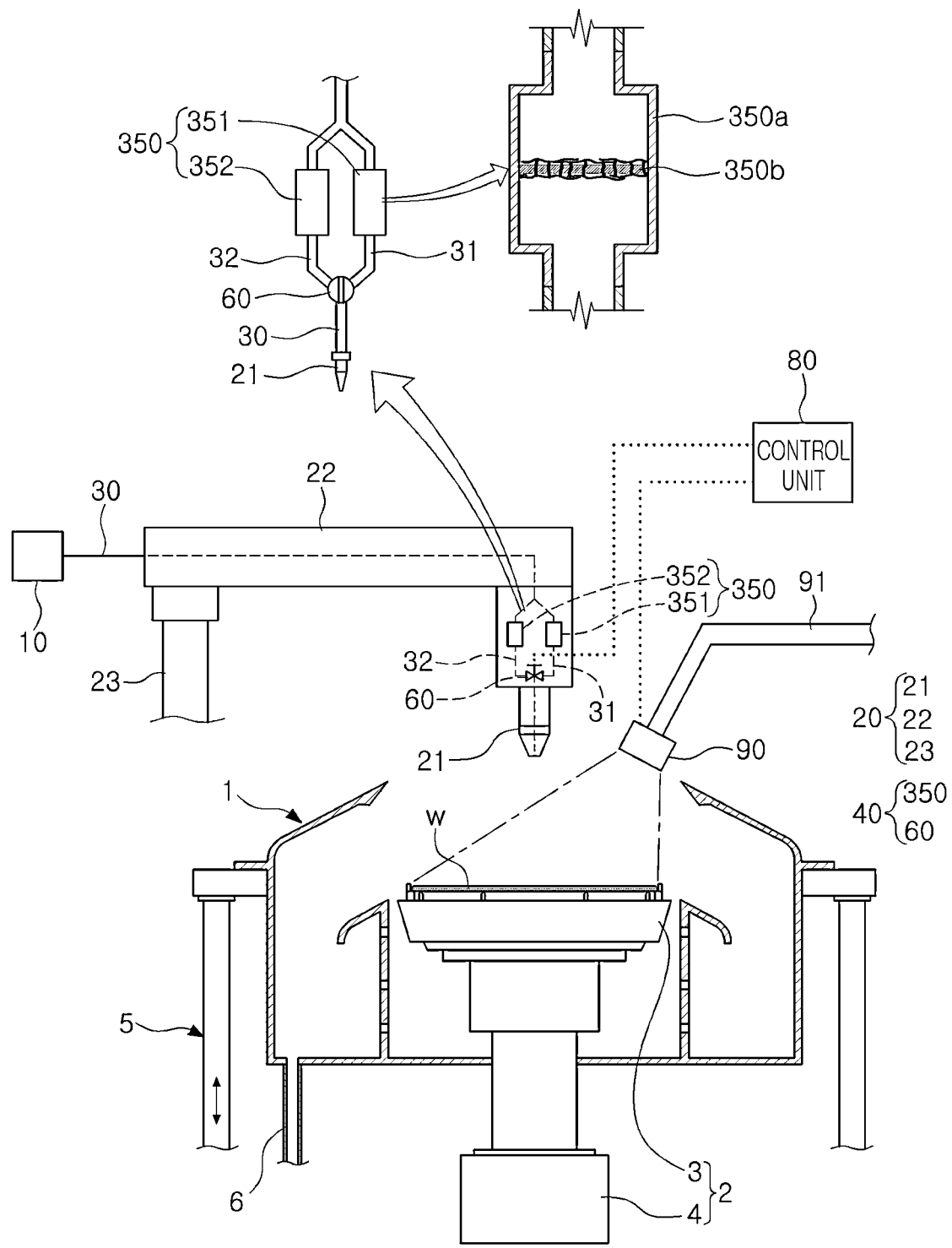

[FIG. 7]
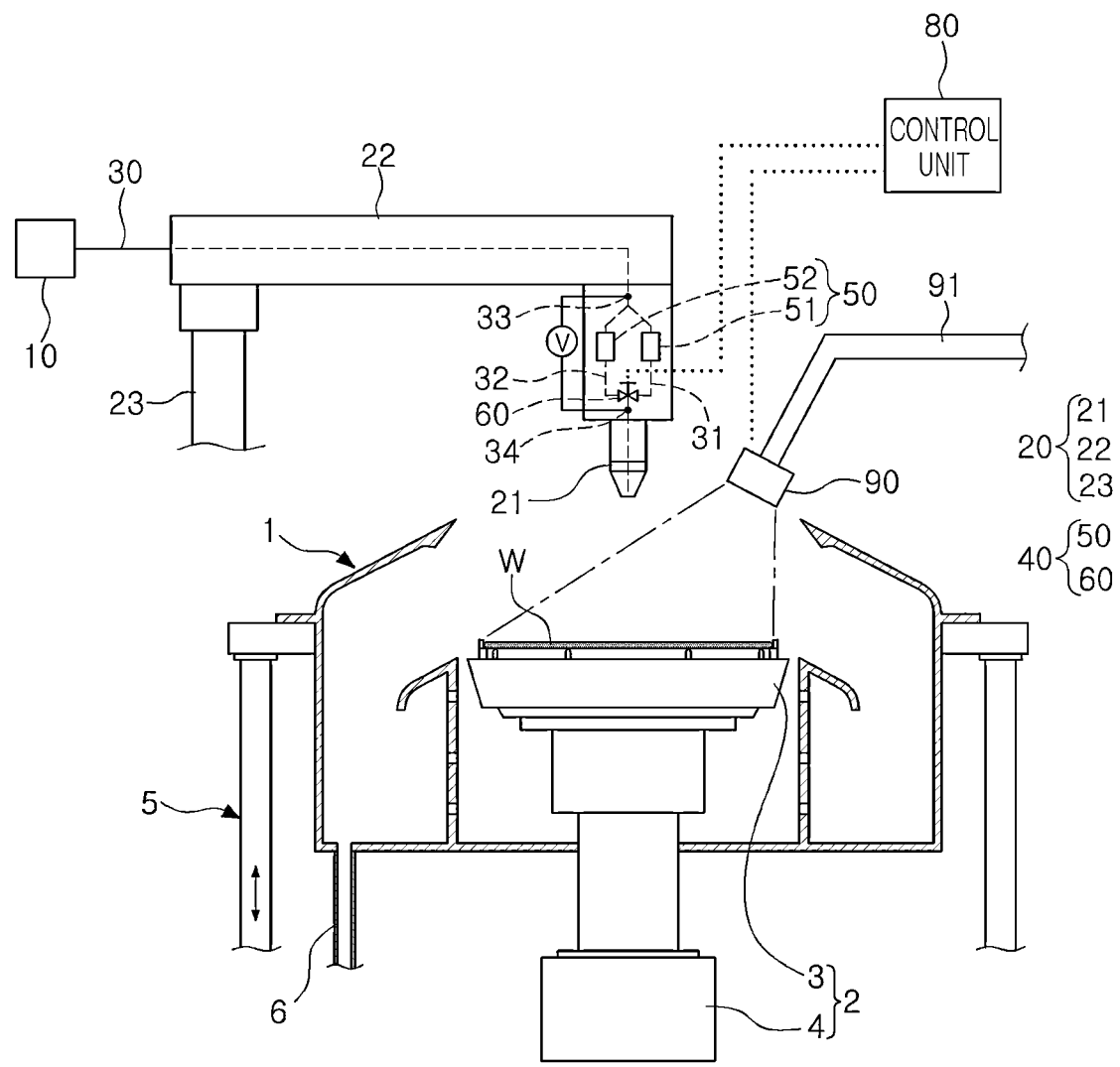

[FIG. 8]
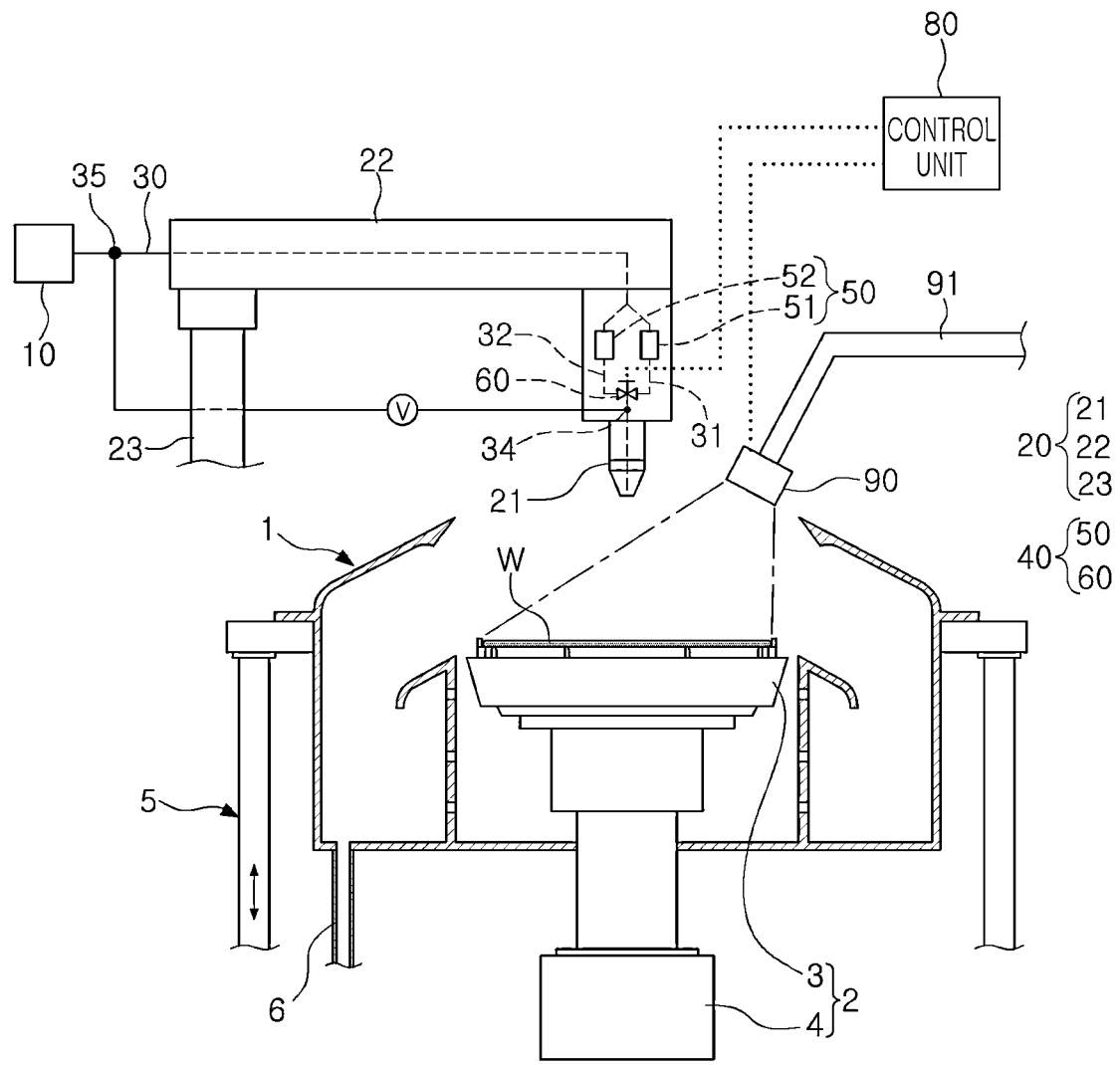

[FIG. 9]
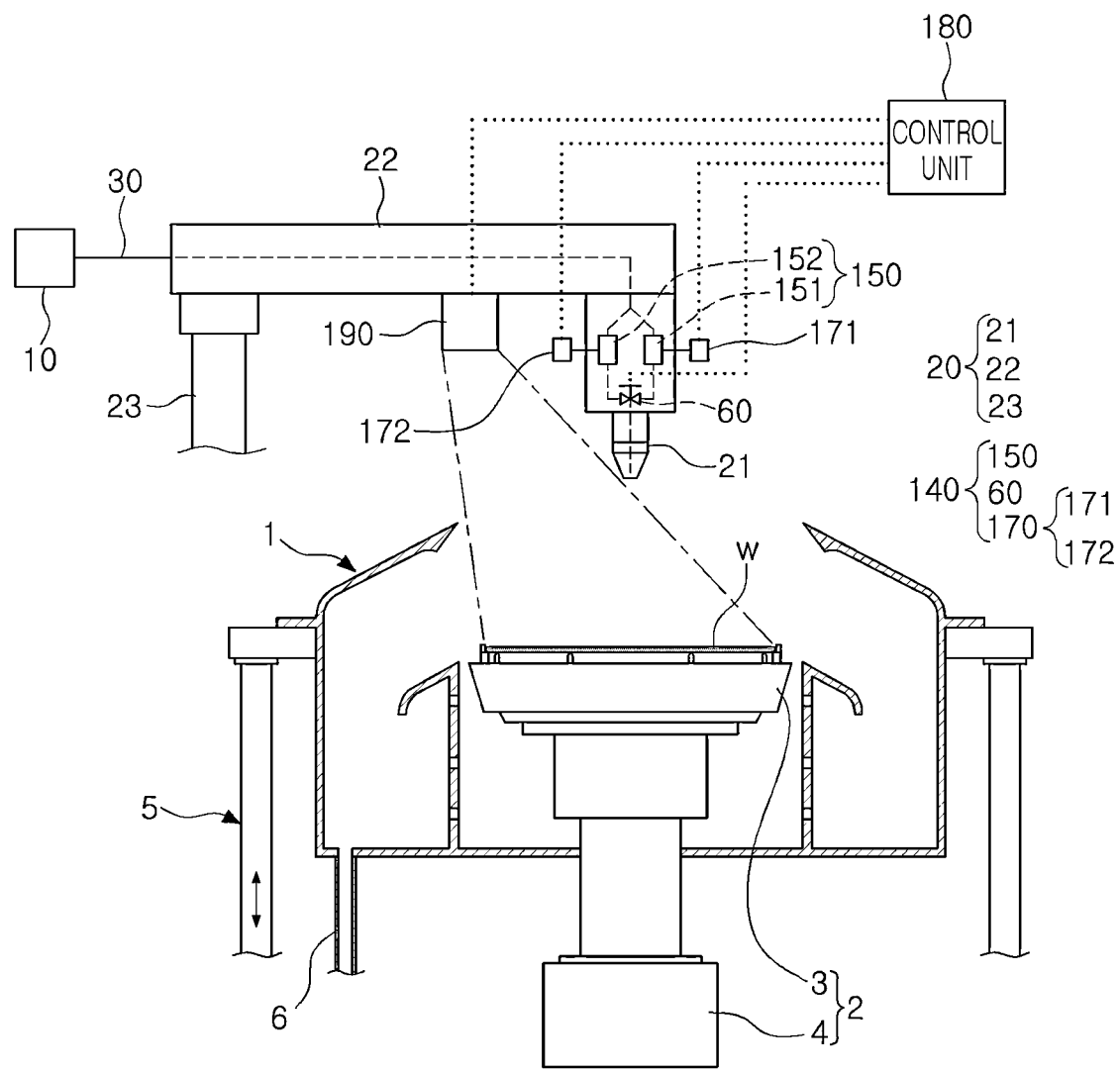

[FIG. 10]
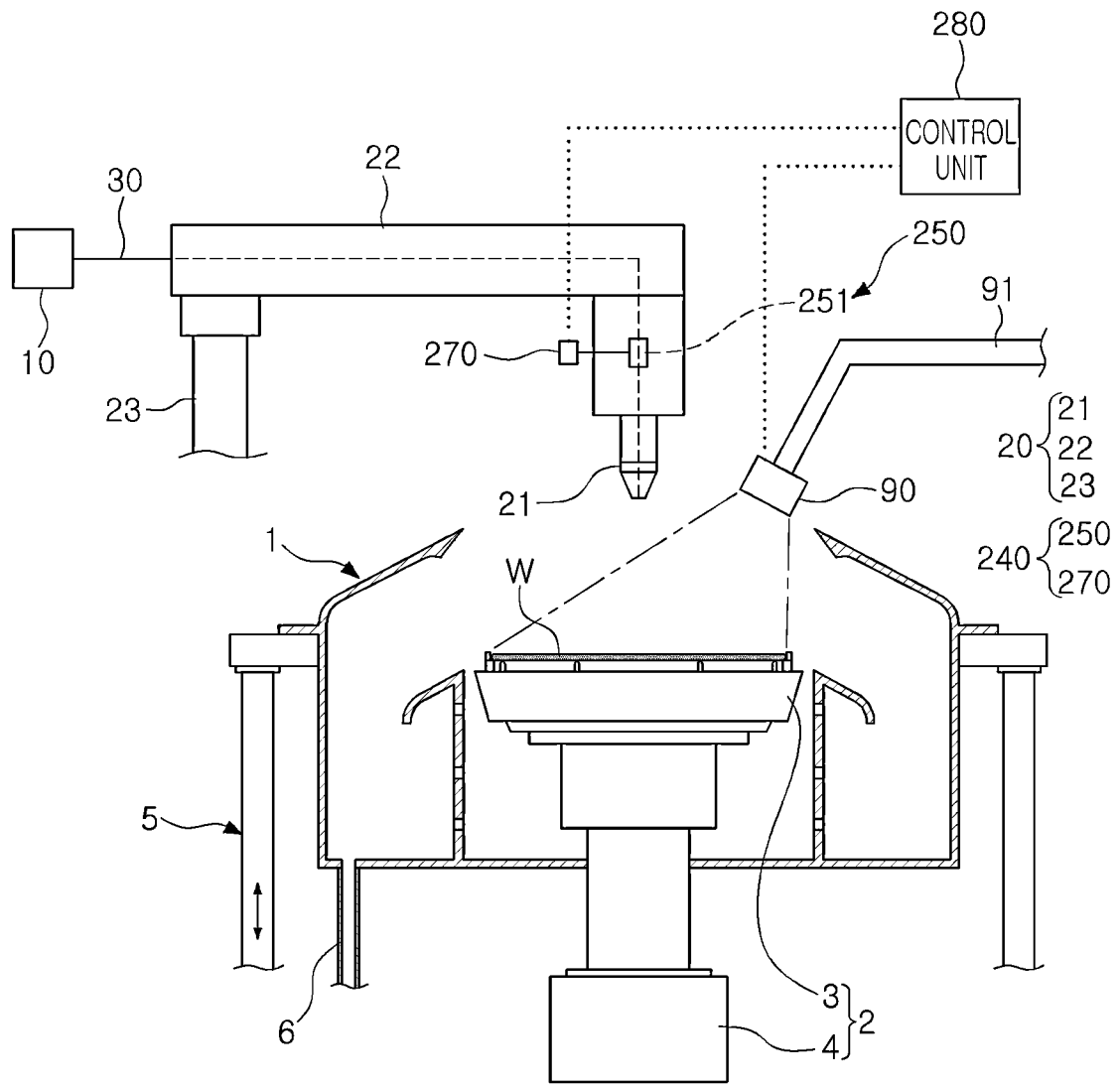
[FIG. 11]
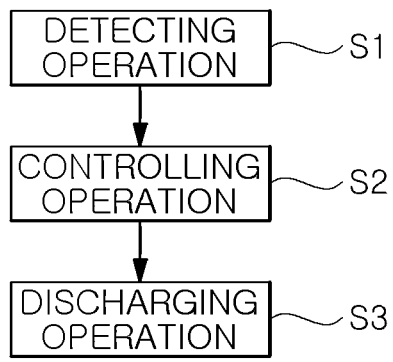

SUBSTRATE PROCESSING APPARATUS AND SUBSTRATE PROCESSING METHOD

CROSS-REFERENCE TO RELATED APPLICATION(S)

This application claims benefit of priority to Korean Patent Application No. 10-2021-0193592 filed on Dec. 31, 2021 in the Korean Intellectual Property Office, the disclosure of which is incorporated herein by reference in its entirety.

BACKGROUND

1. Field

The present disclosure relates to a substrate processing apparatus and a substrate processing method, and more particularly, to a substrate processing apparatus and a substrate processing method which may adjust a charged state of a substrate by controlling the amount of charge of a processing liquid, passing through a filter unit, to discharge the processing liquid.

2. Description of Related Art

A substrate processing apparatus is used in a process of manufacturing a semiconductor. The substrate processing apparatus supplies a processing liquid to a substrate to be processed, such as a semiconductor wafer, to perform liquid processing. In such a substrate processing apparatus, a porous filter charged with predetermined electric charges may be used to remove impurities such as metallic materials in liquid. During substrate processing, a processing liquid discharged from a nozzle toward a substrate or static electricity of the substrate may cause particles to be attached to the substrate, resulting in contamination of the substrate, or may cause static electricity to be discharged to the substrate, resulting in defects of the substrate.

In general, various methods have been proposed to address the above-described issues. As an example, a method in which a nozzle portion, configured to discharge a processing liquid, is coated with an antistatic material to neutralize charges of the processing liquid, a method in which an additional light source unit is disposed in a substrate processing space to irradiate light to a processing liquid, discharged from a nozzle portion, to neutralize charges of the processing liquid, or the like, has been applied.

SUMMARY

An aspect of the present disclosure is to provide a substrate processing apparatus and a substrate processing method which may effectively adjust a charged state of a substrate.

According to an aspect of the present disclosure, a substrate processing apparatus includes: a nozzle unit configured to discharge a processing liquid to a substrate; a pipe connected to the nozzle unit and a processing liquid supply unit supplying the processing liquid; a charge amount control unit disposed at the pipe, including a filter unit charged with positive charges or negative charges, and including at least one of a control valve, controlling a flow rate of the processing liquid passing through an inside of the filter unit, and a power supply unit, applying a voltage to the filter unit, to control a charge amount of the processing liquid; and a control unit connected to the charge amount control unit.

According to another aspect of the present disclosure, a substrate processing apparatus includes: a processing container in which a space for processing a subtract is provided; a substrate support member disposed inside the processing container to support the substrate; a nozzle unit including a nozzle tip for discharging a processing liquid to the substrate, a nozzle arm having one end to which the nozzle tip is connected, and a nozzle arm support member configured to support the nozzle arm; a pipe having a portion disposed inside the nozzle arm and connected to the nozzle tip and a processing liquid supply unit supplying the processing liquid; a charge amount control unit including a first filter charged with positive charges and a second filter charged with negative charges, disposed in parallel, and a control valve disposed at a joined point of a downstream side of the pipe, at which the first filter and the second filter are disposed, and configured to control a flow rate of a processing liquid passing through the first filter and the second filter; a detection unit configured to detect a charged state of the substrate; and a control unit connected to the control valve and the detection unit to control the control valve depending on the charged state of the substrate detected by the detection unit.

According to another aspect of the present disclosure, a substrate processing method includes: a detecting operation in which a charged state of a substrate is detected; a controlling operation in which a charge amount of a processing liquid, passing through a filter unit charged with positive or negative charges depending on the detected charged state of the substrate, is controlled; and a discharging operation in which the processing liquid having the controlled charge amount is discharged to the substrate.

BRIEF DESCRIPTION OF DRAWINGS

The above and other aspects, features, and advantages of the present disclosure will be more clearly understood from the following detailed description, taken in conjunction with the accompanying drawings.

FIG. 1 is a schematic diagram of a substrate processing apparatus according to an example embodiment.

FIG. 2 is a schematic diagram of a filter unit provided in a substrate processing apparatus according to an example embodiment.

FIG. 3 is a schematic diagram of a cross-section of a filter unit provided in a substrate processing apparatus according to an example embodiment.

FIG. 4 is a schematic diagram of a substrate processing apparatus to which the filter unit of FIG. 3 is applied.

FIG. 5 is a schematic diagram of a cross-section of another filter unit provided in a substrate processing apparatus according to an example embodiment.

FIG. 6 is a schematic diagram of a substrate processing apparatus according to an example embodiment to which a filter unit having another structure is applied.

FIGS. 7 and 8 are schematic diagrams of a substrate processing apparatus according to an example embodiment, illustrating different voltage difference measurement positions.

FIG. 9 is a schematic diagram of a substrate processing apparatus according to another example embodiment.

FIG. 10 is a schematic diagram of a substrate processing apparatus according to another example embodiment.

FIG. 11 is a flowchart illustrating a substrate processing method according to an example embodiment.

DETAILED DESCRIPTION

Hereinafter, preferred embodiments will be described in detail such that those of ordinary skill in the art easily practices the present disclosure with reference to the accompanying drawings. However, in describing a preferred embodiment of the present disclosure in detail, if it is determined that a detailed description of a related known function or configuration unnecessarily obscures the gist of the present disclosure, the detailed description thereof will be omitted. In addition, the same reference numerals may be used throughout the drawings for parts having similar functions and operations. In addition, in this specification, terms such as 'on,' 'upper portion,' 'upper surface,' 'below,' 'lower portion,' 'lower surface,' 'side surface,' and the like may be based on the drawings, and in fact, may be changed depending on a direction in which components is disposed.

In addition, throughout the specification, when a portion is 'connected' to another portion, may include not only 'directly connected' but also 'indirectly connected' to other components interposed therebetween. In addition, 'including' a certain component means that other components are further included, rather than excluding other components, unless otherwise stated.

In general, a substrate processing apparatus is used in a process of manufacturing a semiconductor. The substrate processing apparatus supplies a processing liquid to a substrate to be processed, such as a semiconductor wafer, to perform liquid processing. During substrate processing, a processing liquid discharged from a nozzle toward a substrate or static electricity of the substrate may cause particles to be attached to the substrate, resulting in contamination of the substrate, or may cause static electricity to be discharged to the substrate, resulting in defects of the substrate.

Various methods have been proposed to address the above-described issues. The various method include a method in which a nozzle portion, configured to discharge a processing liquid, is coated with an antistatic material to neutralize charges of the processing liquid, a method in which an additional light source unit is disposed in a substrate processing space to irradiate light to a processing liquid, discharged from a nozzle portion, to neutralize charges of the processing liquid, or the like. However, in such a method, a processing liquid is discharged to a substrate in a state in which charges of the processing liquid are neutralized. Therefore, a case in which static electricity is present in a substrate, a state in which a substrate is charged by friction with the substrate, or the like, is unable to be controlled.

Example embodiments provide a substrate processing apparatus. A substrate processing apparatus according to example embodiments may be used in various processes. As an example, a substrate processing apparatus according to example embodiments may be used in a photolithography process. For example, the substrate processing apparatus according to example embodiments may be used in a coating operation, a cleaning operation, a developing operation, or the like, to supply a processing liquid, such as photoresist, thinner, cleaning solution, developer, or the like, to a substrate using a processing liquid supply means to process the substrate. In addition, the substrate processing apparatus according to example embodiments may also be used in other processes such as a cleaning process, or the like.

Hereinafter, a first embodiment and a second embodiment of a substrate processing apparatus according to example embodiments will be described with reference to accompanying drawings.

First Embodiment

First Example

The first example of a substrate processing apparatus will be described with reference to FIGS. 1 to 4.

FIG. 1 is a schematic diagram of a substrate processing apparatus according to the first example. Referring to FIG. 1, a substrate processing apparatus according to an example embodiment may include a processing container 1 disposed inside a sealed processing chamber S to provide a space, in which a substrate W is processed, in the processing container 1, a substrate support member 2 disposed inside the processing container 1 to support the substrate W, and a processing liquid supply unit supplying a processing liquid to the substrate W.

The processing container 1 may receive the processing liquid scattered from the substrate W when the processing liquid is discharged, and may recover the processing liquid through a process liquid recovery line 6 of the processing container 1.

The substrate support member 2 may include a spin chuck 3, supporting the substrate W to be rotatable and vertically movable inside the processing container 1, and a driving unit 4 driving the spin chuck 3. Accordingly, when the substrate W is processed, the processing liquid may be supplied to the substrate W through the processing liquid supply unit in a state, in which the substrate W is rotationally supported by the spin chuck 3, to process the substrate W.

The processing liquid supply unit may include a processing liquid supply unit 10, a nozzle portion 20, a pipe 30, and a charge control unit 40.

The processing liquid supply unit 10 is configured to store the processing liquid or to supply the stored processing liquid to the nozzle portion 20, and may be connected to the pipe 30 through the nozzle portion 20, discharging the processing liquid toward the substrate W, to supply the processing liquid to the nozzle portion 20. The processing liquid stored in the processing liquid supply unit 10 may be a photosensitive liquid, a coating liquid such as thinner, a developer, a deionized liquid, a cleaning liquid, or the like, but is not limited thereto. The substrate processing method may be performed by applying various processing liquids depending on actual process needs.

The nozzle portion 20 may discharge the processing liquid to the substrate, and may be connected to the processing liquid supply unit 10 through the pipe 30. The nozzle portion 20 may include a nozzle tip 21, discharging the processing liquid to the substrate W, and a nozzle arm 22 having one end to which the nozzle tip 21 is connected. The other end of the nozzle arm 22 may be connected to a nozzle arm support member 23 such that the nozzle arm 21 may move through the nozzle arm support member 23, as necessary.

The charge amount control unit 40 is disposed at the pipe 30 between the processing liquid supply unit 10 and the nozzle portion 20, and may be configured to change a charge amount of the processing liquid discharged to the nozzle portion 20 through the charge amount control unit 40.

In addition, the filter unit 50 may be disposed at the pipe 30 adjacent to the nozzle tip 21 to precisely control a charge amount of the processing liquid discharged from the nozzle tip 21. For example, a portion of the pipe 30 may be disposed inside the nozzle arm 22, and the filter unit 50 may be disposed at the nozzle arm 22 adjacent to the nozzle tip 21.

The charge amount control unit 40 may include the filter unit 50 charged with positive or negative charges, and may include a control valve 60, controlling a flow rate of the processing liquid passing through an inside of the filter unit 50, to be configured to control a charge amount of the processing liquid passing through the filter unit 50.

In the present disclosure, it should be noted that "the filter unit 50 is configured to be charged with negative or positive charges" means that the filter unit 50 may be charged with negative or positive charges in advance through a plasma treatment, or the like, as applied to the first embodiment, or the filter unit 20 may be charged with negative charges or positive charges due to friction with a processing liquid when the treatment liquid including materials, which may be easily charged with negative or positive charges, passes therethrough, or the filter unit 50 may be charged with negative charges or positive charges by a charging device, applying a voltage, as necessary, as applied to the second embodiment.

In first example, the charge amount control unit 40 including a control valve 60, controlling a flow rate of a processing liquid passing through the inside of the filter unit 50 without including a power supply portion, will be described. In this case, the filter unit 50 may include a material charged with negative or positive charges in advance or a material easily charged with negative or positive charges, which will be described below with reference to FIGS. 1 to 4 in detail.

When ions in the processing liquid pass through the filter unit 50 charged with such specific charges, a flowing current may be generated. Therefore, after the processing liquid passes through the filter unit 50, a predetermined amount of charges may be increased, so that the processing liquid may be charged with specific charges to be discharged to the substrate W through the nozzle portion 20.

In addition, the substrate processing apparatus may include a control unit 80 controlling a charge amount of the processing liquid in the pipe 30. For example, in the present example, the control unit 80 may be configured to control the control valve 60 controlling the flow rate of the processing liquid passing through the filter unit 50 of the charge amount control unit 40 depending on a charged state of the substrate W.

The control unit 80 may control a charge amount of the processing liquid which has passed through the filter unit 50 in various manners. The filter unit 50 may include a plurality of filters, so that the control potion 80 may control a charge amount of the processing liquid through selective passage of the processing liquid depending on the charged state of the substrate W. In addition, the filter unit 50 may include a plurality of filters, so that the control unit 80 may control a charge amount of the processing liquid by adjusting a flow rate of the processing liquid passing through each of the filters depending on the charged state of the substrate W. In FIG. 1, the filter unit 50 is illustrated as including two filters, the number of filters is not limited thereto, and the filter unit 50 may include a single filter, or three or more filters, as necessary.

According to the substrate processing apparatus according to the first example, the control unit 80 may control the control value 60 controlling the flow rate of the processing liquid passing through the filter unit 50 charged with positive charges or negative charges from the pipe 30 through the processing liquid supply unit 10 depending on the charged state of the substrate W, so that the amount of charge of the processing liquid flowing to the nozzle portion 20 may be actively controlled, and thus, the processing liquid having the controlled amount of charges may be discharged to the substrate W through the nozzle portion 20. Accordingly, the charged state of the substrate W may be effectively adjusted, so that static electricity charged to the substrate W may be removed to prevent an electrostatic discharge (ESD) phenomenon from occurring when the substrate W and the processing liquid are brought into contact with each other and, furthermore, to effectively prevent defects of the substrate W caused by arcing, or the like, of the substrate W. In addition, the charged state of the substrate may be effectively controlled, so that the substrate W may be controlled to have a charged state appropriate to the next process. As an example, in an application operation of the photolithography process, when photoresist is discharged to the substrate W applied with a thinner layer charged with negative charges, the control unit 80 may control a flow rate of the photoresist, passing through the filter unit 50 depending on the charged state of the substrate W charged with negative charged, so that the photoresist may be controlled to be charged with positive charged, and the photoresist charged with the positive charges may be discharged to the substrate W through the nozzle portion 20 to be neutralized to neutralize the substrate W.

As another example, in a developing operation of the photolithography process, when a material easily charged with positive charges is stacked on an underlying layer of a surface to be developed of the substrate W, the control unit 80 may control a flow rate of a developer, passing through the filter unit 50, through the control value 60 to charge with developer with negative charges, so that the developer charged with the negative charges may be discharged to the substrate W to be neutralized, and thus the material of the underlying layer of the substrate W may be effectively prevented from being charged with positive charges during a developing treatment.

For example, the filter unit 50 may include at least two filters charged with different charges. As illustrated in FIG. 1, the filter unit 50 may include a first filter 51, charged with positive charges, and a second filter 52 charged with negative charges. Although the first filter 51 and the second filter 52 are illustrated as being connected to each other in parallel, example embodiments are not limited thereto and the first filter 51 and the second filter 52 may be connected to each other in series.

FIG. 2 is a schematic diagram of a filter unit provided in a substrate processing apparatus according to an example embodiment, FIG. 3 is a schematic diagram of a cross-section of a filter unit provided in a substrate processing apparatus according to an example embodiment, and FIG. 4 is a schematic diagram of a substrate processing apparatus to which the filter unit of FIG. 3 is applied.

Referring to FIGS. 2 and 3, in the case of the first filter 51 charged with positive charges in the filter unit 50, when the processing liquid passes through the first filter 51, the positive charges may be rejected due to charge repulsion with the first filter 51 charged with the positive charges to be difficult to pass through the first filter 51. Meanwhile, negative charges in the processing liquid may easily pass through the first filter 51 due to charge attraction with the first filter 51. Accordingly, the processing liquid passing through the first filter 51 may be entirely charged with the negative charges and may be discharged to the substrate W through the nozzle portion 20.

Similarly, in the case of the second filter 52 that is negatively charged in the filter unit 50, when the processing liquid passes through the second filter 52, negative charges in the processing liquid may be rejected due to charge repulsion of the second filter 52, charged with the negative charges, to be difficult to pass through the second filter 52. Meanwhile, positive charges in the processing liquid may easily pass through the second filter 52 due to charge attraction with the second filter 52. Accordingly, the processing liquid passing through the second filter 52 may be entirely charged with the positive charges and may be discharged to the substrate W through the nozzle portion 20.

The first filter 51 may include a porous film charged with positive charges, and the second filter 52 may include a porous film charged with negative charges.

As an example, as illustrated in FIGS. 3 and 4, each of the first filter 51 and the second filter 52 may include a body 50*a*, including porous films charged with positive charges and negative charges, and a plurality of through-holes 50*b* formed to penetrate through from one side surface of an upstream side of the body 50*a* to the other side surface of a downstream side in direction in which the processing liquid flows. The processing liquid may be implemented to smoothly flow through the plurality of through-holes 50*b*. As illustrated in FIG. 3, the through-holes 50*b* may be formed to have the same diameter.

In FIG. 3, pipes connected to a filter unit are configured to have the same diameter, but example embodiments are not limited thereto. In order for the processing liquid to easily pass through the filter part and to smoothly flow, a piping in which the filter unit is disposed may be implemented in the form of an expansion tube having a diameter gradually increased in a direction in which the processing liquid flows.

When the filter unit 50 includes the first filter 51 and the second filter 352, the first filter 51 and the second filter 52 may be connected to each other in parallel to control a flow rate of the processing liquid passing through the first filter 51 and the second filter 52. Hereinafter, a method of controlling the flow rate of the processing liquid passing through the filter unit 50 including the first filter 51 and the second filter 52 will be described with reference to FIG. 4.

For example, referring to FIG. 4, the pipe 30 may include a first branch pipe 31 and a second branch pipe 32 branching off in parallel. The first filter 51 of the filter unit 50 may be disposed on the first branch pipe 31, and the second filter 52 may be disposed on the second branch pipe 32. In this case, the control valve 60 may be disposed at point, in which the first branch pipe 31 and the second branch pipe 32 are joined, to be connected the control unit 80 to control an overall flow rate of the processing liquid passing through each of the first filter 51 and the second filter 52 while passing through the first branch pipe 31 and the second branch pipe 32. For example, when the processing liquid supplied to the nozzle portion 20 should be charged with positive charges, the control valve 60 may be controlled such that a flow rate of the processing liquid charged with negative charges through the first filter 51 in a state of being charged with positive charges while passing through the first branch pipe 31 is higher than a flow rate of the processing liquid charged with positive charged through the second filter 52 in a state of being charged with negative charges while passing through the second branch pipe 32.

As an example, the control unit 80 may control the control valve 60 to supply a processing liquid, having a charging polarity opposite to a charging polarity of the substrate W, to the substrate W. When a surface to be processed of the substrate W is charged with positive charges, the flow rate of the processing liquid passing through the first filter 51 and the second filter 52 may be controlled, so that the processing fluid may be finally charged to the substrate in a state of being charged with negative charges. Accordingly, the processing liquid may be neutralized with the substrate W to remove static electricity of the substrate w. Furthermore, particles on the substrate W may be trapped to be removed.

The substrate processing apparatus according to example embodiments may include a detection unit 90 detecting a charged state of the substrate W. The control unit 80 may be configured to receive a detection signal regarding the charged state of the substrate W from the detection unit 90, and thus may control the control valve 60 based on the detection signal to control a charge amount of the processing liquid. The detection unit 90 may be implemented in various forms. As an example, an electrostatic measurement device may be used as the detection unit 90. For example, an electric field generated by a surface of the substrate W may be detected using an electric field measurement device which may measure an electric field in a non-contact state with the substrate W. The detection signal detected by the detection unit 90 may be transmitted to the control unit 80, so that the control unit 80 may control the control valve 60 to control a charge amount of the processing liquid passing through the filter unit 50.

The detection unit 90 may be disposed in various positions within a processing space. As illustrated in FIG. 4, the detection unit 90 may be supported by a detection unit support arm 91, configured to be separate from the nozzle arm 22 of the nozzle portion, and may be disposed on one upper side of the substrate W to detect the charged state of the substrate W. Furthermore, the detection unit support arm 91 may movably support the detection unit 90 such that the detection unit 90 may be moved to various positions within the processing space to detect the charged state of the substrate in the various positions.

In the present example, an electric field measurement device has been described as being used as the detection unit. However, the detection unit is not limited thereto, and may be implemented in various forms such as an ion detector, or the like, as long it may detect a charged state of a substrate.

In the substrate processing apparatus according to the first example, the control unit 80 may be connected in parallel through a pipe from the processing liquid supply unit based on the detection signal regarding the charged state of the substrate, through the detection unit 90 to control a flow rate of the processing liquid passing through the first filter 51 charged with positive charges and a flow rate of the processing liquid passing through the second filter 52 charged with negative charges. Accordingly, the control unit 50 may actively control a charge amount of the processing liquid, finally jointed after passing through the first filter 51 and the second filter 52, such that the processing liquid is discharged to the substrate W through the nozzle portion 20 to effectively adjust the charged state of the substrate W, so that static electricity charged to the substrate W may be removed to prevent an ESD phenomenon from occurring when the substrate W and the processing liquid are brought into contact with each other and, furthermore, to effectively prevent defects of the substrate W caused by arcing, or the like, of the substrate W.

In particular, the substrate processing apparatus according to the first example may easily control a charge amount of the processing liquid with a simple structure through the charge amount control unit 40 including the filter unit 50 and the control valve 60 passing through the filter unit 50.

Furthermore, a flow rate of the processing liquid, passing through the first filter 51 charged with positive charged and the second filter 52 charged with negative charges and disposed in parallel to the first filter 51, may be easily controlled through the control valve 60, and the filter unit 50 including the first filter 51 and the second filter 52 and the charge amount control unit 40 including the control valve 60 may be installed at the pipe 30, disposed on the nozzle arm 22, to be applied as a structure assembled to be integrated with the nozzle unit 20, to implemented a simplified structure, and to reduce manufacturing costs.

First Modified Example of First Example

FIG. 5 is a schematic diagram of a cross-section of another filter unit provided in a substrate processing apparatus according to an example embodiment.

A substrate processing apparatus according to a first modified example of the first example will be described with reference to FIG. 5. In the first modified example, components except for a filter unit 450 may be the same as those of the first example, and descriptions thereof will be omitted to avoid redundancy.

Referring to FIG. 5, a first filter and a second filter of a filter unit 450 may each include a body 450*a*, including porous films charged with positive charges and negative charges, and a plurality of through-holes 450*b* formed to penetrate through from one side surface of an upstream side of the body 450*a* to the other side surface of a downstream side in a direction in which a processing liquid flows. The through-hole 40*c* of the first filter or the second filter of the filter unit 450 may be configured to have a tapered shape in which a diameter of a hole is gradually increased from one side surface of the upstream side of the body 40*a* to the other side surface of the downstream side of the body 40*a*. The processing liquid may be implemented to smoothly flow through the plurality of through-holes 50*b*. However, the filter unit 50 according to example embodiments is not limited to such a form, and may be implemented in various forms as long as it may pass through specific charges while securing a smooth flow of the processing liquid.

Second Modified Example of First Example

FIG. 6 is a schematic diagram of a substrate processing apparatus according to an example embodiment to which a filter unit having another structure is applied.

A substrate processing apparatus according to a second modified example of the first example will be described with reference to FIG. 6. In the second modified example, components except for a filter unit 350 may be the same as those of the first example, and descriptions thereof will be omitted to avoid redundancy.

In the second modified example of the first example, referring to FIG. 6, a filter unit 350 may have a structure in which a porous film 350*b* coated with a polymeric monomer charged with negative or positive charges is fixed in a filter housing 350*a*. For example, when the filter unit 350 includes a first filter 351 charged with positive charges and a second filter 352 charged with negative charges, the first filter 351 may have a structure in which a porous film 350*b* coated with a polymeric monomer charged with positive charges is fixed, and the second filter 352 may have a structure in which a porous film 350*b* coated with a polymeric monomer charged with negative charges is fixed. It should be appreciated that the polymeric monometer charged with positive or negative charges does not serve to react with the processing liquid, but serve to allow ions having polarity opposite to polarity of the polymeric monomer in the processing liquid to pass therethrough and to forbid ions having the same polarity as the polymeric monomer to pass therethrough without reaction with the processing liquid.

A method of controlling a flow rate of the processing liquid, passing through the first filter 351 and the second filter 352, is the same as the method of controlling the flow rate of the processing liquid passing through the first filter 51 and the second filter 52 according to the first example, and thus will be omitted therein.

Third Modified Example of First Example

FIG. 7 is a schematic diagram of a substrate processing apparatus including a voltage difference measurement unit according to a third modified example of the first example.

A substrate processing apparatus according to a third modified example of the first example will be described with reference to FIG. 7. In the third modified example, components except for a measurement unit may be the same as those of the first example, and descriptions thereof will be omitted to avoid redundancy.

The substrate processing apparatus according to the third modified example of the first example may further include a voltage difference measurement unit.

As illustrated in FIG. 7, the voltage difference measurement unit may be connected to upstream and downstream of the filter unit 50 in a direction in which a processing liquid is supplied, and may measure a voltage difference of the processing liquid passing through the upstream and the downstream of the filter unit 50. For example, the voltage difference measurement unit may be connected to upstream of a branching point 33 of a pipe 30 at which a first filter 51 and a second filter 52 are disposed (a point at which a first branch pipe 31 and a second branch pipe 32 branch off) and downstream of a joined point 34 (a point at which the first branch pipe 31 and the second branch pipe 32 are joined) in the direction in which the processing liquid is supplied, and may measure a voltage difference of the processing liquid passing through the upstream of the branching point of the pipe, at which the first filter 51 and the second filter 52 are disposed, and the downstream of the joined point 34. In this case, a control unit 80 may be configured to control a control valve 60 in consideration of a measurement result of the voltage difference measurement unit. Accordingly, the control unit 80 may obtain feedback on a voltage difference of the processing liquid before and after passing through the filter unit 50 depending on a charged state of the substrate W to more precisely control a charge amount of the processing liquid discharged to the substrate W.

Fourth Modified Example of Example 1

FIG. 8 is a schematic diagram of a substrate processing apparatus including a voltage difference measurement unit according to a fourth modified example of the first example.

A substrate processing apparatus according to a fourth modified example of the first example will be described with reference to FIG. 8. In the fourth modified example, components except for a voltage difference measurement unit may be the same as those of the first example, and descriptions thereof will be omitted to avoid redundancy.

The substrate processing apparatus according to the fourth example of the first embodiment may further include a voltage difference measurement unit.

As another example, as illustrated in FIG. 8, the voltage difference measurement unit may be connected to a pipe 35 connected to an outlet portion of a processing liquid supply unit 10 and downstream of the filter unit 50 in a direction in which a processing liquid is supplied, and may measure a voltage difference of the processing liquid passing through the pipe 35 connected to the outlet portion of the processing liquid supply unit 10 and the downstream of the filter unit 50. For example, the voltage difference measurement unit may be connected to the pipe 35 connected to the outlet portion of the processing liquid supply unit 10 and the joined point 34 of the pipe at which the first filter 51 and the second filter 52 are disposed (a point at which the first branch pipe 31 and a second branch pipe 32 are joined) in the direction in which the processing liquid is supplied, and may measure the voltage difference of the processing liquid passing through the pipe 35 connected to the outlet portion of the processing liquid supply unit 10 and the downstream of the joined point 34 of the pipe at which the first filter 51 and the second filter 52 are disposed. In this case, a control unit 80 may be configured to control a control valve 60 in consideration of a measurement result of the voltage difference measurement unit.

The substrate processing apparatuses according to the first example of the first embodiment and the first to fourth modified examples of the first example have been described as having a structure to which a first filter and a second filter, disposed in parallel and charged with positive charges in advance, and a charge amount control unit, including a control value, are applied. However, example embodiments are not limited thereto and the substrate processing apparatuses may be implemented in various forms. Hereinafter, a substrate processing apparatus according to a second embodiment will be described.

Second Embodiment

Second Example

FIG. 9 is a diagram illustrating an example of a substrate processing apparatus according to a second example to which a charge amount control unit including a power supply unit is applied.

A substrate processing apparatus according to the second example will be described with reference to FIG. 9. Components except for a charge amount control unit 140 and a detection unit 190 may be the same as those of the first example, and descriptions thereof will be omitted to avoid redundancy.

Referring to FIG. 9, the charge amount control unit 140 according to the present example may be implemented to provide a power supply unit 170, supplying a voltage to a filter unit 150, to apply a voltage, corresponding to a charged state of the substrate W, such that the substrate W is charged with positive or negative charges.

The filter unit 150 may include at least one filter, and the power supply unit 170 may be provided as a single power supply unit or provided to correspond to the number of filters, as necessary.

The second example will be described with reference to FIG. 9 as an example of a charge amount control unit 140 including a filter unit 150 including a first filter 151 and a second filter 152 disposed in parallel and respectively charged with positive charges and negative charges, a control valve 60 controlling a flow rate of a processing liquid passing through the first filter 151 and the second filter 152, and a power supply unit 170 including a first power supply unit 171 applying a voltage to the first filter 151 and a second power supply unit 172 applying a voltage to the second filter 152.

Referring to FIG. 9, the charge amount control unit 140 of the substrate processing apparatus may further include a first power supply unit 171, connected to the control unit 180 and applying positive charges to the first filter 151, and a second power supply unit 172 connected to the control unit 180 and applying negative charges to the second filter 152. The control unit 180 may control operations of the first power supply unit 171 and the second power supply unit 172 depending on a charged state of the substrate W. The first power supply unit 171 and the second power supply unit 172 may apply a fixed voltage having a constant level to the filter unit 150. In this case, the first filter 151 and the second filter 152 may be disposed in parallel as illustrated in FIG. 8 to control a flow rate of a processing liquid, passing through the first filter 151 charged with positive charges and the second filter 152 charged with negative charges, through a control value 60 in the same manner as described in the first example, and thus may control a charge amount of the processing liquid. A detailed description thereof will be omitted to avoid redundancy.

The substrate processing apparatus may also include a detection unit 190 detecting the charged state of the substrate W. The control unit 180 may be configured to control a charge amount of the processing liquid by receiving a detection signal regarding the charging state of the substrate W from the detection unit 190 and controlling the control valve 60 based on the detection signal. The detection unit 190 may be implemented in various forms. As an example, an electrostatic measurement device may be used as the detection unit 190. For example, an electric field generated by a surface of the substrate W may be detected using an electric field measurement device which may measure an electric field in a non-contact state with the substrate W. The detection signal detected by the detection unit 190 may be transmitted to the control unit 180, so that the control unit 180 may control the control valve 60 to control a charge amount of the processing liquid passing through the filter unit 150.

The detection unit 90 may be disposed in various positions within a processing space. As illustrated in FIG. 9, the detection unit 90 may be installed on a nozzle arm 22, to which the nozzle tip 21 is connected, to be moved integrally with the nozzle arm 20.

The substrate processing apparatus according to the second example may include the same voltage difference measurement unit as described in the third modified example of the first example or the fourth modified example of the first example, which will be described below in brief.

Similarly to the voltage difference measurement position of the voltage difference measurement unit illustrated in FIG. 7 referenced in the third modified example of the first example of the first embodiment, the voltage difference measurement unit may be connected to a pipe 35 connected to an outlet portion of a processing liquid supply unit 10 and downstream of a joined point 34 (a point at which a first branch pipe 31 and a second branch pipe 32 are joined) of the pipe 35, at which a first filter 151 and a second filter 152 are disposed in a direction in which the processing liquid is supplied, and may measure a voltage difference of the processing liquid passing through upstream of a branching point 33 of the pipe 31, at which the first filter 151 and the second filter 152 are disposed, and the downstream of the joined point 34. In this case, the control unit 180 may be configured to control the control valve 60, the first power supply unit 171, and the second power supply circuit 172 in consideration of the measurement result of the voltage difference measurement unit. Accordingly, the control unit 180 may obtain feedback on a voltage difference of the processing liquid before and after passing through the filter unit 150 depending on a charged state of the substrate W to more precisely control a charge amount of the processing liquid discharged to the substrate W.

In addition, similarly to the voltage difference measurement position of the voltage difference measurement unit illustrated in FIG. 7 referenced in the fourth modified example of the first example of the first embodiment, the voltage difference measurement unit may be connected to a pipe 35 connected to the outlet portion of the processing liquid supply unit 10 and the downstream of the joined point 34 (the point at which the first branch pipe 31 and the second branch pipe 32 are joined) of the pipe 35, at which the first filter 151 and the second filter 152 are disposed in the direction in which the processing liquid is supplied, and may measure a voltage difference of the processing liquid passing through the pipe 35, at which the first filter 151 and the second filter 152 are disposed, and the downstream of the joined point 34 of the pipe 32 at which the first filter 151 and the second filter 152 are disposed. In this case, the control unit 180 may be configured to control the control valve 60, the first power supply unit 171, and the second power supply circuit 172 in consideration of the measurement result of the voltage difference measurement unit.

In the substrate processing apparatus according to the second example, the control unit 80 may control the first power supply unit 171, the second power supply unit 172, and the control value 60 based on through the detection unit 90 based on the detection signal regarding the charged state of the substrate W detected by the detection unit 90 to control a flow rate of the processing liquid passing through the first filter 151 connected from the processing liquid supply unit 10 through the pipe to be charged with positive charges by the first power supply unit 171 and a flow rate of the processing liquid passing through the second filter 151 charged with negative charges by the second power supply unit 172. Accordingly, the control unit 50 may actively control a charge amount of the processing liquid, finally jointed after passing through the first filter 51 and the second filter 52, such that the processing liquid are discharged to the substrate W through the nozzle portion 20 to effectively adjust the charged state of the substrate W, so that static electricity charged to the substrate W may be removed to prevent an ESD phenomenon from occurring when the substrate W and the processing liquid are brought into contact with each other and, furthermore, to effectively prevent defects of the substrate W caused by arcing, or the like, of the substrate W.

In the second example, the control unit has been described as a control method in which the first power supply unit 171 and the second power supply unit 172 apply a fixed voltage to the first filter 151 and the second filter 152, but example embodiments are not limited thereto. As a modified example of the second example, the control unit 80 may control the first power supply unit and the second power supply unit to change an input voltage in real time depending on the charged state of the substrate and to apply the changed voltage to the first filter and the second filter, as necessary.

In addition, the case in which the first filter 151 and the second filter 152 are disposed in parallel has been described in the second example, but a first filter and a second filter may be connected to each other in series, as a modified example of the second example. In this case, a bypass pipe may be disposed to allow a processing liquid to selectively pass through the first filter and the second filter.

Third Example

FIG. 10 is a diagram illustrating an example of a substrate processing apparatus according to a third example to which a filter unit including a single third filter and a charge amount control unit including a single power supply unit are applied.

A substrate processing apparatus according to a third example will be described with reference to FIG. 10. Components except for a charge amount control unit 240 may be the same as those of the second example, and descriptions thereof will be omitted to avoid redundancy.

Referring to FIG. 10, the charge amount control unit 240 according to the present embodiment may include a filter unit 250, including a single third filter 251, and a power supply unit supplying a voltage to the third filter 251 to apply a voltage, corresponding to a charged state of a substrate W, to the substrate W such that the substrate W is charged with positive or negative charges.

In the third example, the control unit 80 may be configured to control a charged state of the filter unit 250 depending on the charged state of the substrate W. For example, the control unit 280 may be implemented in such a manner that a voltage applied to the third filter 251 is controlled to selectively charge the third filter 251 positive charges or negative charges depending on the charged state of the substrate W. For example, the control unit 280 may control the power supply unit 270 to change an input voltage in real time depending on the charged state of the substrate W and to apply the changed voltage to the third filter 251.

In the substrate processing apparatus according to the third example, the control unit 250 may control the power supply unit 270 based on a detection signal regarding the charging state of the substrate detected by the detection unit 90 to actively control a charge amount of the processing liquid passing through a third filter 251 charged with charges, (for example, negative charges) corresponding to the charged state of the substrate, among positive charges or negative charges. Accordingly, the processing liquid may be discharged to the substrate W through the nozzle unit 20 to effectively adjust the charged state of the substrate W, so that static electricity charged to the substrate W may be removed to prevent an ESD phenomenon from occurring when the substrate W and the processing liquid are brought into contact with each other and, furthermore, to effectively prevent defects of the substrate W caused by arcing, or the like, of the substrate W.

What should be described is that, in the second embodiment, in the case of the second and third examples in which power supply units 170 and 270, a first power supply unit 171, and a second power supply unit 172 are provided, the filter units 150 and 250 are allowed to be charged with positive or negative charges using a structure in which a conductive layer is formed to be electrically connected to the power supply units 170 and 270, the first power supply unit 171, and the second power supply unit 172. In this case, a shape or a structure of the filter units 150 and 250 is not limited and may be implemented in various forms as long as the filter portions 150 and 250 may be provided with a conductive layer to be charged with positive or negative charges by a power supply unit.

In addition, in the first and second examples with reference to FIGS. 1 to 10, the charge amount control units 40, 140, and 240 are illustrated and described as being disposed at a pipe inside a nozzle arm, but example embodiments are not limited thereto, and the filter unit 50 of the charge amount control unit 40 may be disposed at a pipe disposed outside the nozzle arm 20.

Example embodiments further provide a substrate processing method.

FIG. 11 is a flowchart illustrating a substrate processing method according to an example embodiment.

Referring to FIG. 11, the substrate processing method according to an example embodiment may include a detecting operation S1, a controlling operation S2, and a discharging operation S3. For example, a charged state of a substrate may be detected in the detecting operation S1, a charge amount of a processing liquid passing through the filter unit charged with positive or negative charges depending on the charged state of the substrate is controlled in the controlling operation S2, and the process liquid having the controlled charge amount may be discharged in the discharging operation S3.

Furthermore, in the controlling operation S2 of the substrate processing method according to an example embodiment, a processing liquid having charging polarity opposite to a charging polarity of the substrate may be supplied to the substrate.

Hereinafter, operations of processing a substrate using the substrate processing apparatus and the substrate processing method according to example embodiments will be described with reference the drawing below.

In the substrate processing apparatus, a detection unit 90 may detect a charged state of a substrate W in the detecting operation S1, a detection signal regarding the charged state of the substrate W detected in the detecting operation S2 may be transmitted to a control unit 80, 180, or 280, the control unit 80, 180, or 280 may control a charge amount of a processing liquid passing through a filter unit 50, 150, or 250 based on the detection signal, and the processing liquid having the controlled charge amount may be discharged to the substrate W in the discharging operation S3.

In the case of the substrate processing apparatus according to the first example described with reference to FIG. 1 in which the charge amount control unit 40 includes the filter unit 50 including the first filter 51 charged with positive charges and the second filter 52 charged with negative charges and disposed in parallel to the first filter 51, the control unit 80 may transmit a control signal for controlling a flow rate of the processing liquid passing through the first filter 51 and the second filter 52 to the control valve 60, a charge amount of the processing liquid joined after passing through the first filter 51 and the second filter 52 may be finally controlled and the process amount may then be discharged to the substrate W through the nozzle unit 20, and thus the charged state of the substrate W may be adjusted. As a detailed example, in a charged state in which the substrate W is charged with positive charges, the processing liquid joined after passing through the first filter 51 and the second filter 52 may enter a state of being charged with negative charges by controlling the control valve 60 by the control unit 80, so that the process liquid may be discharged to the substrate W through the nozzle unit 20. Thus, the negative charges may be neutralized with the positive charges of the substrate W to neutralize the substrate W. Accordingly, an ESD phenomenon may be prevented from occurring when the substrate W and the processing liquid are brought into contact with each other.

In addition, in the case of the substrate processing apparatus according to the second example described with reference to FIG. 9 in which the charge amount control unit 140 includes the first power supply unit 171 and the second power supply unit 172, disposed in parallel, and the first filter 151 applied with positive charges by the first and second power supply units 171 and 172 and the second filter 152 applied with negative charges by the first and second power supply units 171 and 172, the control unit 180 may transmit a control signal for controlling a charge amount of a processing liquid passing through the first filter 151 and the second filter 152 based on a detection signal regarding a charged state of the substrate W to the first power supply unit 171, the second power supply unit 172, and the control valve 60 to operate the first power supply unit 171 and the second power supply unit 172 may operate such that the charge amount of the processing liquid joined after passing through the first filter 151 and the second filter 152 may be finally controlled by the control value 60 in a state in which positive charges are applied to the first filter 151 and negative charges are applied to the second filter 152. Accordingly, the charged state of the substrate W may be adjusted.

In addition, in the case of the substrate processing apparatus according to the third example described with reference to FIG. 10 in which the charge amount control unit 240 includes the power supply unit 270 and a filter unit 250 including a third filter 251 to which positive charges or negative charges are selectively applied by the power supply unit 270, the control unit 280 may transmit a control signal for controlling the third filter 251 to the power supply unit 270 based on a detection signal regarding a charged state of the substrate W to operate the power supply unit 270 such that the charge amount of the processing liquid passing through the third filter 251 may be adjusted in a state in which positive or negative charges are applied to the third filter 251, and the processing liquid may then be discharged to the substrate W through the nozzle unit 20. Accordingly, the charged state of the substrate W may be adjusted.

As a result, according to the substrate processing apparatus and substrate processing method described above, a control unit may actively control a charge amount of a processing liquid passing through a filter unit, charged with positive or negative charges, from a processing liquid supply unit through a pipe depending on a charged state of a substrate W, so that the processing liquid having a controlled charge amount may be discharged to the substrate W through a nozzle unit to effectively adjust the charged state of the substrate W. Accordingly, static electricity charged to the substrate W may be removed to prevent an ESD phenomenon from occurring when the substrate W and the processing liquid are brought into contact with each other and, furthermore, to effectively prevent defects of the substrate W caused by arcing, or the like, of the substrate W.

As described above, in the substrate processing apparatus according to example embodiments, a control unit may actively control a charge amount of a processing liquid passing through a filter unit, charged with positive or negative charges, from a processing liquid supply unit through a pipe depending on a charged state of a substrate, so that the processing liquid having a controlled charge amount may be discharged to the substrate through a nozzle unit to effectively adjust the charged state of the substrate. Accordingly, static electricity charged to the substrate W may be removed to prevent an ESD phenomenon from occurring when the substrate and the processing liquid are brought into contact with each other and, furthermore, to effectively prevent defects of the substrate caused by arcing, or the like, of the substrate.

On the other hand, in the substrate processing method according to example embodiments, a charge amount of a processing liquid passing through a filter unit charged with positive or negative charges depending on a charged state of a substrate may be actively controlled, so that the processing liquid may be discharged to the substrate to effectively adjust the charged state of the substrate. Accordingly, static electricity charged to the substrate W may be removed to prevent an ESD phenomenon from occurring when the substrate and the processing liquid are brought into contact with each other and, furthermore, to effectively prevent defects of the substrate caused by arcing, or the like, of the substrate.

While example embodiments have been shown and described above, it will be apparent to those skilled in the art that modifications and variations could be made without departing from the scope of the present disclosure as defined by the appended claims.

What is claimed is:

1. A substrate processing apparatus comprising:
a nozzle unit configured to discharge a processing liquid to a substrate;
a pipe connected to the nozzle unit and a processing liquid supply unit supplying the processing liquid;
a charge amount control unit disposed at the pipe, including a filter unit charged with positive charges or negative charges, and including a control valve, controlling a flow rate of the processing liquid passing through an inside of the filter unit, and a power supply unit, applying a voltage to the filter unit, to control a charge amount of the processing liquid; and
a control unit connected to the charge amount control unit,
wherein the filter unit includes at least two filters charged with different charges,
wherein the pipe includes a first branch pipe and a second branch pipe branching off in parallel, and the filter unit includes a first filter, disposed at the first branch pipe and charged with positive charges, and a second filter disposed at the second branch pipe and charged with negative charges,
wherein the charge amount control unit includes the control valve disposed at a point, at which the first branch pipe and the second branch pipe are joined, and connected to the control unit to control a flow rate of a processing liquid passing through the first branch pipe and the second branch pipe.

2. The substrate processing apparatus of claim 1 wherein the first filter includes a porous film charged with positive charges, and the second filter includes a porous film charged with positive charges.

3. The substrate processing apparatus of claim 1, wherein the charge amount control unit includes a power supply unit connected to the control unit and configured to apply a voltage to at least one of the first filter and the second filter.

4. The substrate processing apparatus of claim 3, wherein the power supply unit includes a first power supply unit, configured to apply positive charges to the first filter, and a second power supply unit configured to apply negative charges to the second filter.

5. The substrate processing apparatus of claim 3, wherein—the power supply unit applies a voltage, corresponding to the charged state of the substrate, to the at least one of the first filter and the second filter.

6. The substrate processing apparatus of claim 1, wherein the nozzle unit includes a nozzle tip, configured to inject the processing liquid to the substrate, and a nozzle arm having one end to which the nozzle tip is connected, and the filter unit is installed on the nozzle arm.

7. The substrate processing apparatus of claim 1, comprising:
a voltmeter connected to upstream and downstream of the filter unit in a direction, in which the processing liquid is supplied, and configured to measure a voltage difference of the processing liquid passing through the upstream and the downstream of the filter unit,
wherein
the control unit is configured to control the charge amount control unit in consideration of a measurement result of the voltmeter.

8. The substrate processing apparatus of claim 1, comprising:
a voltmeter connected to a pipe connected to an outlet portion of the processing liquid supply unit and downstream of the filter unit in a direction, in which the processing liquid is supplied, and configured to measure a voltage difference of a processing liquid passing through the pipe connected to the outlet portion of the processing supply unit and the downstream of the filter unit,
wherein
the control unit is configured to control the charge amount control unit in consideration of a measurement result of the voltmeter.

9. The substrate processing apparatus of claim 1, comprising:
an electric field measurement device configured to detect a charged state of the substrate,
wherein
the control unit is connected to the electric field measurement device and receives a detection signal regarding the charged state of the substrate from the electric field measurement device to control the charge amount control unit based on the detection signal.

10. The substrate processing apparatus of claim 9, wherein
the electric field measurement device is installed on a nozzle arm at which the nozzle unit is disposed.

11. A substrate processing apparatus comprising:
a processing container in which a space for processing a substrate is provided;
a substrate support member disposed inside the processing container to support the substrate;
a nozzle unit including a nozzle tip for discharging a processing liquid to the substrate, a nozzle arm having one end to which the nozzle tip is connected, and a nozzle arm support member configured to support the nozzle arm;
a pipe having a portion disposed inside the nozzle arm and connected to the nozzle tip and a processing liquid supply unit supplying the processing liquid;
a charge amount control unit including a first filter charged with positive charges and a second filter charged with negative charges, disposed in parallel, and a control valve disposed at a joined point of a downstream side of the pipe, at which the first filter and the second filter are disposed, and configured to control a flow rate of a processing liquid passing through the first filter and the second filter;
an electric field measurement device configured to detect a charged state of the substrate; and
a control unit connected to the control valve and the electric field measurement device to control the control valve depending on the charged state of the substrate detected by the electric field measurement device.

12. The substrate processing apparatus of claim 11, wherein
the charge amount control unit is installed on the nozzle arm adjacent to the nozzle tip.

13. The substrate processing apparatus of claim 11, wherein
the electric field measurement device is installed on the nozzle arm.

14. The substrate processing apparatus of claim 11, wherein
the pipe includes a first branch pipe and a second branch pipe branching off in parallel,
the first filter is disposed at the first branch pipe, and the second filter is disposed at the second branch pipe, and,
the substrate processing apparatus comprises:
a voltmeter connected to upstream of a branching point, at which the first branch pipe and the second branch pipe branch off, and downstream of a joined point, at which the first branch pipe and the second branch pipe are joined, and configured to measure a voltage difference of a processing liquid passing through upstream of the branching point and downstream of the joined point, and,
the control unit is configured to control the control valve in consideration of measurement result of the voltmeter.

15. The substrate processing apparatus of claim 11, comprising:
a voltage difference measurement unit connected to a pipe connected to an outlet portion of the processing liquid supply unit and downstream of a joined point of the pipe, at which the first filter and the second filter are disposed, and configured to measure a voltage difference of a processing liquid passing through the pipe connected to the outlet portion of the processing supply unit and the downstream of the joined point of the pipe at which the first filter and the second filter are disposed,
wherein
the control unit is configured to control the control valve in consideration of a measurement result of the voltage difference measurement unit.

16. A substrate processing method comprising:
a detecting operation in which a charged state of a substrate is detected;
a controlling operation in which a charge amount of a processing liquid, passing through a filter unit including a first filter charged with positive es charges and a second filter charged with negative charges depending on the detected charged state of the substrate, is controlled; and
a discharging operation in which the processing liquid having the controlled charge amount is discharged to the substrate,
wherein in the controlling operation, a flow rate of a processing liquid passing through the first filter and the second filter is controlled by a control valve, and the charge amount of the processing liquid joined after passing through the first filter and the second filter is adjusted.

* * * * *